United States Patent
Kropfitsch et al.

(10) Patent No.: US 9,722,563 B2
(45) Date of Patent: *Aug. 1, 2017

(54) SYSTEM AND METHOD FOR HIGH INPUT CAPACITIVE SIGNAL AMPLIFIER

(71) Applicant: Infineon Technologies AG, Neubiberg (DE)

(72) Inventors: Michael Kropfitsch, Koettmannsdorf (AT); Jose Luis Ceballos, Villach (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

This patent is subject to a terminal disclaimer.

(21) Appl. No.: 15/230,946

(22) Filed: Aug. 8, 2016

(65) Prior Publication Data
US 2016/0344360 A1 Nov. 24, 2016

Related U.S. Application Data

(63) Continuation of application No. 14/163,733, filed on Jan. 24, 2014, now Pat. No. 9,413,317, which is a (Continued)

(51) Int. Cl.
*H03G 7/08* (2006.01)
*H03G 7/06* (2006.01)
(Continued)

(52) U.S. Cl.
CPC ............ *H03G 7/08* (2013.01); *H03F 1/3211* (2013.01); *H03F 3/187* (2013.01); (Continued)

(58) Field of Classification Search
CPC .......... H03G 3/002; H03G 7/06; H03G 7/002; H03R 3/00; H03F 3/189; H03F 3/45475;
(Continued)

(56) References Cited

U.S. PATENT DOCUMENTS

| 4,112,384 A | 9/1978 | Buchberger |
| 4,525,856 A | 6/1985 | Admiraal et al. |

(Continued)

FOREIGN PATENT DOCUMENTS

| CN | 1047586 A | 12/1990 |
| CN | 1741685 A | 3/2006 |

(Continued)

OTHER PUBLICATIONS

Delbruek, T., et al., "Analog VLSI Adaptive, Logarithmic, Wide-Dynamic-Range Photoreceptor," 4 pages; Jan. 1994.
(Continued)

*Primary Examiner* — Lam T Mai
(74) *Attorney, Agent, or Firm* — Slater Matsil, LLP

(57) ABSTRACT

In accordance with an embodiment, a method includes determining an amplitude of an input signal provided by a capacitive signal source, compressing the input signal in an analog domain to form a compressed analog signal based on the determined amplitude, converting the compressed analog signal to a compressed digital signal, and decompressing the digital signal in a digital domain to form a decompressed digital signal. In an embodiment, compressing the analog signal includes adjusting a first gain of an amplifier coupled to the capacitive signal source, and decompressing the digital signal comprises adjusting a second gain of a digital processing block.

25 Claims, 8 Drawing Sheets

Related U.S. Application Data continuation of application No. 13/447,792, filed on Apr. 16, 2012, now Pat. No. 8,638,249.

(51) Int. Cl.

| | | |
|---|---|---|
| *H03F 1/32* | (2006.01) | |
| *H03F 3/187* | (2006.01) | |
| *H03F 3/45* | (2006.01) | |
| *H03G 7/00* | (2006.01) | |
| *H03G 3/00* | (2006.01) | |
| *H04R 3/00* | (2006.01) | |
| *H04R 23/00* | (2006.01) | |
| *H03G 3/30* | (2006.01) | |
| *H03K 5/1532* | (2006.01) | |
| *H03K 5/1536* | (2006.01) | |
| *H04R 19/04* | (2006.01) | |

(52) U.S. Cl.
CPC ......... *H03F 3/45475* (2013.01); *H03G 3/002* (2013.01); *H03G 3/3005* (2013.01); *H03G 3/3089* (2013.01); *H03G 7/002* (2013.01); *H03G 7/06* (2013.01); *H03K 5/1532* (2013.01); *H03K 5/1536* (2013.01); *H04R 3/00* (2013.01); *H04R 19/04* (2013.01); *H04R 23/00* (2013.01); *H03F 2200/555* (2013.01); *H03F 2203/45166* (2013.01); *H03F 2203/45526* (2013.01); *H04R 2201/003* (2013.01)

(58) Field of Classification Search
CPC ..... H03F 2203/45166; H03F 2203/455; H03F 2203/26; H03F 3/187
USPC .......... 341/130–155; 333/174; 330/109, 140, 330/302, 254, 279, 129, 278; 329/347; 455/323, 306, 333, 141, 146, 147; 375/233, 316, 345, 347, 260; 348/572, 348/725, 255, 241, 229.1, E5.091
See application file for complete search history.

(56) References Cited

U.S. PATENT DOCUMENTS

| | | | |
|---|---|---|---|
| 4,536,616 A | 8/1985 | Kaire | |
| 5,089,820 A | 2/1992 | Gorai et al. | |
| 5,363,147 A | 11/1994 | Joseph et al. | |
| 5,399,989 A | 3/1995 | Chern | |
| 6,121,908 A | 9/2000 | Sevastopoulos et al. | |
| 6,266,423 B1 | 7/2001 | Werrbach | |
| 6,429,988 B1 | 8/2002 | Bhaumik et al. | |
| 6,654,248 B1 | 11/2003 | Fishley et al. | |
| 6,822,507 B2 | 11/2004 | Buchele | |
| 6,975,193 B2 | 12/2005 | Knieser et al. | |
| 7,088,981 B2 | 8/2006 | Chang | |
| 7,171,010 B2 | 1/2007 | Martin et al. | |
| 7,230,555 B2 | 6/2007 | Dolazza et al. | |
| 7,286,811 B2 | 10/2007 | Kral | |
| 7,304,679 B1 | 12/2007 | Johnson et al. | |
| 7,386,074 B1 | 6/2008 | Venkatesh et al. | |
| 7,522,193 B2 | 4/2009 | Itani et al. | |
| 7,548,626 B2 | 6/2009 | Stenberg et al. | |
| 7,589,766 B2 | 9/2009 | Itani et al. | |
| 7,646,883 B2 | 1/2010 | Kogure et al. | |
| 7,663,432 B2 | 2/2010 | Prandi et al. | |
| 7,697,702 B2 | 4/2010 | Akino | |
| 7,719,595 B1 | 5/2010 | Johnson et al. | |
| 7,734,272 B2 | 6/2010 | Kral | |
| 7,761,067 B1 | 7/2010 | Tsai et al. | |
| 7,986,182 B2 | 7/2011 | Prandi et al. | |
| 8,004,350 B2 | 8/2011 | Draxelmayr | |
| 8,036,401 B2 | 10/2011 | Poulsen et al. | |
| 8,067,958 B2 | 11/2011 | Draxelmayr | |
| 8,199,927 B1 | 6/2012 | Raftery | |
| 8,200,179 B1 | 6/2012 | Mosinskis et al. | |
| 8,325,949 B2 | 12/2012 | Qian et al. | |
| 8,374,363 B2 | 2/2013 | Onishi | |
| 8,625,809 B2 | 1/2014 | Josefsson et al. | |
| 8,638,249 B2 * | 1/2014 | Kropfitsch ............. | H03G 3/002 329/347 |
| 9,413,317 B2 * | 8/2016 | Kropfitsch ............. | H03G 3/002 |
| 2003/0155966 A1 | 8/2003 | Harrison | |
| 2006/0083392 A1 | 4/2006 | Akino | |
| 2007/0076904 A1 | 4/2007 | Deruginsky et al. | |
| 2007/0101816 A1 | 5/2007 | Cuffe et al. | |
| 2008/0075306 A1 | 3/2008 | Poulsen et al. | |
| 2009/0003629 A1 | 1/2009 | Shajaan et al. | |
| 2009/0134501 A1 | 5/2009 | Ganitzer et al. | |
| 2009/0316916 A1 | 12/2009 | Haila et al. | |
| 2009/0316935 A1 | 12/2009 | Furst et al. | |
| 2010/0086162 A1 | 4/2010 | Nielsen et al. | |
| 2011/0142261 A1 | 6/2011 | Josefsson | |
| 2011/0150243 A1 | 6/2011 | Onishi | |
| 2011/0175243 A1 | 7/2011 | Jo et al. | |
| 2012/0043974 A1 | 2/2012 | van den Boom et al. | |
| 2012/0250881 A1 | 10/2012 | Mulligan | |
| 2012/0250925 A1 | 10/2012 | Lillelund | |
| 2013/0015919 A1 | 1/2013 | Kropfitsch et al. | |
| 2013/0051582 A1 | 2/2013 | Kropfitsch et al. | |

FOREIGN PATENT DOCUMENTS

| | | |
|---|---|---|
| CN | 1975410 A | 6/2007 |
| CN | 101507105 A | 8/2009 |
| CN | 101771385 A | 7/2010 |
| DE | 202011106756 U1 | 3/2012 |
| EP | 1906704 A1 | 4/2012 |
| KR | 1020060113925 A | 11/2006 |
| KR | 1020070021148 A | 2/2007 |
| KR | 1020080063267 A | 7/2008 |
| WO | 0178446 A1 | 10/2001 |
| WO | 2009135815 A1 | 11/2009 |

OTHER PUBLICATIONS

Feng, P., et al., "History of the High-Voltage Charge Pump," Book Excerpt, Nov. 2006, pp. 1-9, Chapter 1, Professional Engineering 6X9, Charge Pump Circuit Design.

Harrison, R. R., et al., "A Low-Power Low Noise CMOS Amplifier for Neural Recording Applications," IEEE Journal of Solid-State Circuits, Jun. 2003, pp. 958-965, vol. 38, No. 6.

Harrison, R.R., "Integrated Circuits for Neural Interfacing," Circuits for Emerging Technologies, Feb. 15, 2008, pp. 1-12.

Vittoz, E., et al., "CMOS Analog Integrated Circuits Based on Weak Inversion Operation," IEEE Journal of Solid-State Circuits, vol. Sc-12, No. 3, Jun. 1977, pp. 224-231.

\* cited by examiner

SYSTEM AND METHOD FOR HIGH INPUT CAPACITIVE SIGNAL AMPLIFIER

CROSS-REFERENCE TO RELATED APPLICATIONS

This continuation application of U.S. application Ser. No. 14/163,733, filed Jan. 24, 2014, which is a continuation application of U.S. application Ser. No. 13/447,792, filed on Apr. 16, 2012, which application is hereby incorporated herein by reference.

TECHNICAL FIELD

This invention relates generally to semiconductor circuits and methods, and more particularly to an amplifier for a low distortion capacitive signal source.

BACKGROUND

Audio microphones are commonly used in a variety of consumer applications such as cellular telephones, digital audio recorders, personal computers and teleconferencing systems. In particular, lower-cost electret condenser microphones (ECM) are used in mass produced cost sensitive applications. An ECM microphone typically includes a film of electret material that is mounted in a small package having a sound port and electrical output terminals. The electret material is adhered to a diaphragm or makes up the diaphragm itself. Most ECM microphones also include a preamplifier that can be interfaced to an audio front-end amplifier within a target application such as a cell phone. Another type of microphone is a microelectro-mechanical Systems (MEMS) microphone, which can be implemented as a pressure sensitive diaphragm is etched directly onto an integrated circuit.

Environmental sound pressure levels span a very large dynamic range. For example, the threshold of human hearing is at about 0 dBSPL, conversational speech is at about 60 dBSPL, while the sound of a jet aircraft 50 m away is about 140 dBSPL. While the diaphragm of a microphone, such as a MEMS microphone, may be able to withstand high intensity acoustic signals and faithfully convert these high intensity acoustic signals into an electronic signal, dealing with such high-level signals poses some difficulties. For example, many amplifiers and preamplifiers for acoustic microphones are optimized for a particular dynamic range. As such, these systems may not be able to handle the full audio range without adding significant distortion.

SUMMARY

In accordance with an embodiment, a method includes determining an amplitude of an input signal provided by a capacitive signal source, compressing the input signal in an analog domain to form a compressed analog signal based on the determined amplitude, converting the compressed analog signal to a compressed digital signal, and decompressing the digital signal in a digital domain to form a decompressed digital signal. In an embodiment, compressing the analog signal includes adjusting a first gain of an amplifier coupled to the capacitive signal source, and decompressing the digital signal comprises adjusting a second gain of a digital processing block.

The details of one or more embodiments of the invention are set forth in the accompanying drawings and the description below. Other features, objects, and advantages of the invention will be apparent from the description and drawings, and from the claims.

BRIEF DESCRIPTION OF THE DRAWINGS

For a more complete understanding of the present invention, and the advantages thereof, reference is now made to the following descriptions taken in conjunction with the accompanying drawings, in which.

Figure 1A:
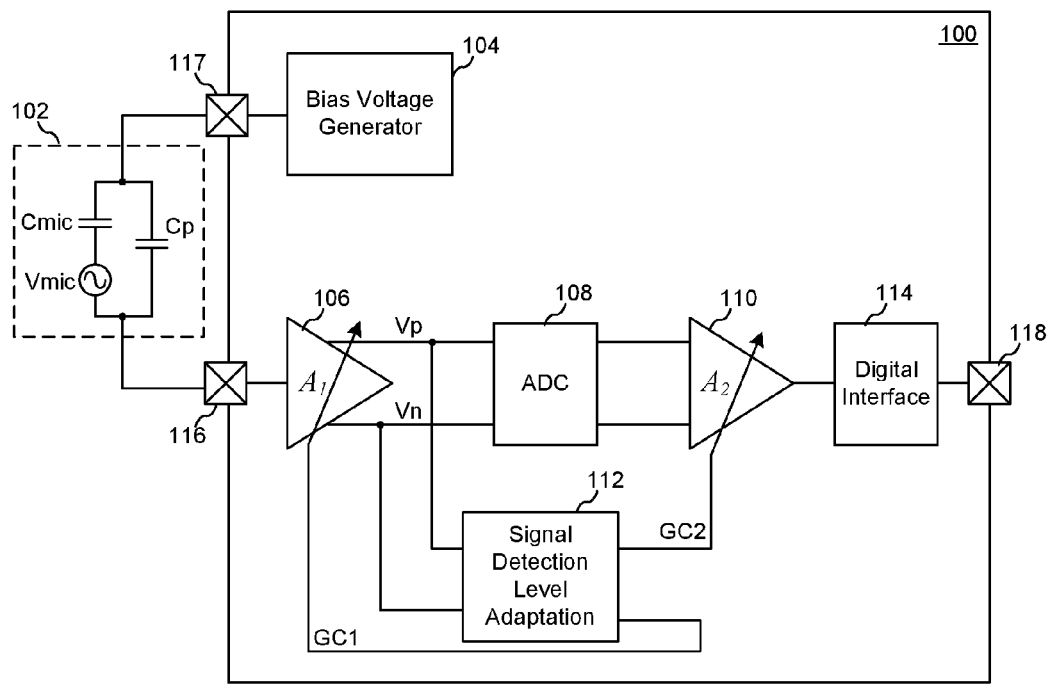
FIGS. 1a-e illustrate an amplifier integrated circuit according to an embodiment of the present invention.

Corresponding numerals and symbols in different figures generally refer to corresponding parts unless otherwise indicated. The figures are drawn to clearly illustrate the relevant aspects of the preferred embodiments and are not necessarily drawn to scale. To more clearly illustrate certain embodiments, a letter indicating variations of the same structure, material, or process step may follow a figure number.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to embodiments in a specific context, namely an amplifier for a capacitive signal source such as a MEMS or an electret condenser microphone (ECM). The invention may also be applied, however, to other types of circuits and systems, such as audio systems, communication systems, sensor systems and other systems that interface to high impedance signal sources.

In an embodiment, an amplifier maintains a large dynamic range of a capacitive signal source, such as a microphone, by compressing the output signal of the capacitive signal source in the analog domain, performing an analog to digital conversion of the compressed signal, and then decompressing the signal in the digital domain. By performing both a compression and decompression, the overall sensitivity of the capacitive sensor or microphone may be kept constant over its complete output range. For example, in some embodiments, a high acoustic signal up to 140 dB SPL may be achieved, while keeping total harmonic distortion of the system below 10%.

In some embodiments, the compressing the output signal of the capacitive signal source is achieved by attenuating the output signal of the capacitive signal source. In some embodiments, the implementation and control of the front-end attenuation may be implemented, for example, as described in co-pending application Ser. No. 13/217,890, entitled System and Method for Low Distortion Capacitive Signal Source Amplifier, filed on Aug. 25, 2011, which application is incorporated by reference herein in its entirety. For example, in one embodiment, the signal may be attenuated by adjusting an impedance coupled to the input of an input amplifier coupled to the output of the capacitive signal source. The input level may be adjusted by controlling a capacitance coupled to the input of the amplifier. In another embodiment, the input level may be adjusted by controlling a resistance coupled to the input of the amplifier, which results in an adjustable high-pass network. Alternatively, other impedance types may be used at the input to the amplifier. In a further embodiment, the input level may be controlled by adjusting a voltage between the two plates of the capacitive sensor, which adjusts the acoustic to electric signal gain of the capacitive sensor itself.

In some embodiments, the microphone or capacitive sensor signal level is sensed at an output of an amplifier stage using a peak detector. The amplitude of the input signal is then adjusted until the output of the amplifier stage is less than peak value determined by the peak detector. In some embodiments, the amplitude of the input signal is adjusted when a zero crossing detector detects an AC zero crossing of the input signal or an amplified input signal. Alternatively, other level or power sensing systems, circuits or methods may be used, such as RMS or average power level detectors.

FIG. 1a illustrates embodiment amplifier integrated circuit (IC) 100 configured to be coupled to MEMS microphone 102, which is shown in dotted lines to indicate that microphone 102 is not necessarily included on IC 100. In some embodiments, microphone 102 may also be included on IC 100 or on a separate die housed within the same package. In alternative embodiments, other microphone types, such as ECM microphones, or other types of capacitive sensor circuits may be used in place of MEMS microphone 102.

IC 100 has variable gain amplifier 106, analog to digital converter (A/D) 108, variable digital gain block no, signal detection and level adaptation block 112, digital interface 114 and bias generator 104. Variable gain amplifier 106 has one or more stages that amplify the output of MEMS microphone 102, which is coupled to IC 100 via input pad 116. In some embodiments, portions of variable gain amplifier 106 may be implemented, for example, as described in co-pending application Ser. No. 13/183,193, entitled System and Method for Capacitive Signal Source Amplifier, filed on Jul. 14, 2011, which application has been incorporated by reference herein in its entirety. Alternatively, variable gain amplifier 106 may be implemented according to techniques known in the art. In an embodiment, digital interface 114 outputs a bitstream or pulse width modulated representation of the microphone signal to output pad 118. Additionally and/or alternatively, a multi-bit output of digital gain block no is provided to an output interface and/or is used internally.

In an embodiment, signal detection and level adaptation block 112 measures an amplitude at the output of variable gain amplifier 106, and calculates gain control signals GC1 and GC2 as a function of the measured amplitude. Alternatively, signal detection and level adaptation block 112 may measure the amplitude of the signal input to amplifier 106. Signal detection and level adaptation block 112, in some embodiments, decreases the gain of variable gain amplifier 106 in response to increasing amplitudes output from capacitive signal source or microphone 102. As signal detection and level adaptation block 112 decreases the gain of variable gain amplifier 106 via GC1, a corresponding increase is made to the gain of variable gain digital block no.

By applying a corresponding increase to digital gain block no in response to a decrease in the gain of variable gain amplifier 106, the sensitivity of the microphone system is linear over a very wide dynamic range.

In some embodiments, the gain of variable gain amplifier 106 and the gain of digital gain block no is fixed for input levels up to a predetermined threshold. Above this threshold, compression is applied to variable gain amplifier 106 and expansion is applied to digital gain block no. In one embodiment, this threshold is set to be at about 115 dB SPL. Alternatively, other thresholds may be used. In some embodiments, this threshold is set in order to use as much of the input dynamic range of A/D converter 108 as possible without clipping the input of A/D converter 108 at high signal levels, and/or without causing excessive audio distortion at high input levels. In alternative embodiments, or in alternative modes, signal detection and level adaptation block 112 may be configured to provide signal amplification at variable gain amplifier 106 and compression at digital gain block no at lower input levels in order to further reduce the noise contribution of the ADC, and in order to relax the system's design requirements regarding area and current consumption. For example, using a higher gain at lower input levels deemphasizes the noise contribution of A/D converter 108 by allowing the noise contribution of capacitive input source 102 and the input stage of variable gain amplifier 106 to become more dominant, thereby resulting in a lower input referred noise level at lower input levels.

In an embodiment, A/D converter 108 may be implemented using an audio oversampling data converter, such as a sigma-delta A/D converter. Alternatively, other A/D architectures may be used. In one embodiment, A/D converter 108 has a sampling rate of about 1 MHz to about 4 MHz, which is reduced to about 8.33 kHz to about 33.33 kHz using a decimation filter. Digital interface 114 provides a bitstream or pulsewidth modulated output at a frequency of about 1 MHz to about 4 MHz. In alternative embodiments, sampling rates outside of these ranges may also be used. Digital output 118 may be used to drive such circuits including, but not limited to decimation filters and other post-processing blocks.

In some embodiments that utilize a MEMS microphone, bias generator 104 provides a bias voltage for microphone 102 itself at pin 117. In some embodiments, this bias voltage may be between about 3V and about 16V depending on the particular microphone and system implementation. Alternatively, other voltage ranges may be used. Bias generator 104 may be omitted if microphone or sensor 102 does not require a bias voltage or if the required bias voltage is provided elsewhere. It should be further appreciated that the components on IC 100 may be implemented using more than one component and/or more than one IC in alternative embodiments.

Figure 1B:
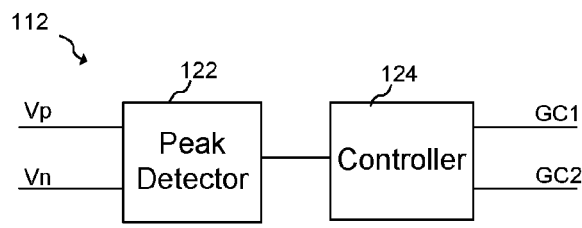

FIG. 1b illustrates an embodiment implementation of signal detection and level adaptation block 112. Peak detector 122 detects peak signals at the output of variable gain amplifier 106 and controller 124 controls the gain of variable gain amplifier 106 via gain control signal GC1 and the gain of digital gain block no via gain control signal GC2 according to the output of peak detector 122. Gain control signal GC1 may be implemented using a digital word, a pulse modulated signal, or an analog signal such as a current or a voltage. Gain control signal GC2 is implemented, for example, as a digital word or a pulse modulated digital signal.

Figure 1C:
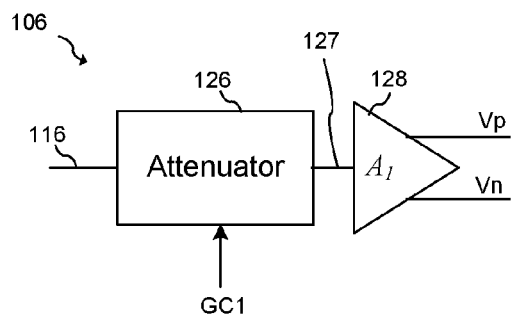

FIG. 1c illustrates variable gain amplifier 106 according to an embodiment of the present invention. Variable gain amplifier 106 includes attenuator 126 followed by amplifier 128. In an embodiment, attenuator 126 may be implemented using a selectable capacitor array, a selectable resistor array, or other active or passive attenuator structures. In an embodiment, the selectable resistor array may be used to shift the corner frequency of an electrical high-pass transfer function in order to provide an adjustable attenuation, where the lower corner frequency is a function of the capacitance of the capacitive sensor and the input impedance of IC 100. Amplifier 128 converts single ended input signal 127 to differential output signal Vp and Vn. Attenuator 126 and amplifier 128 may be implemented using circuits described in co-pending application Ser. Nos. 13/183,193 and 13/217, 890, or using other amplifier structures known in the art. Alternatively, the gain of amplifier 128 may also be controlled by gain control signal GC1.

Figure 1D:
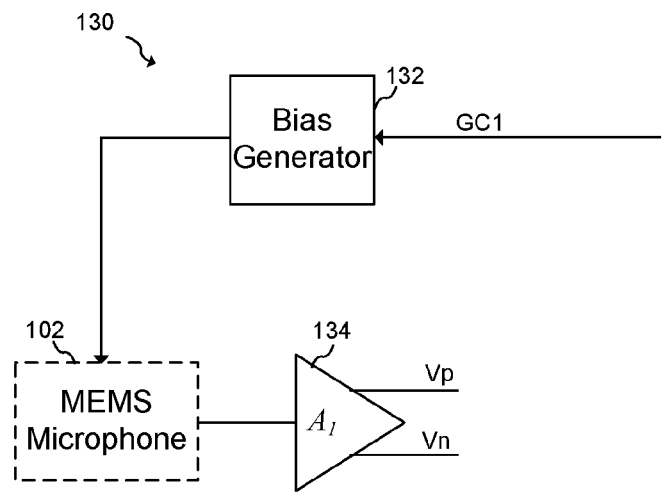

FIG. 1*d* illustrates an alternative circuit for implementing a variable gain at the input. Here, gain control signal GC1 controls bias generator 132 that provides a bias voltage to MEMS microphone 102 that is coupled to amplifier 134. In some embodiments, the gain of MEMS microphone 102 is proportional to the provided bias voltage. By varying the bias voltage in response to the detected peak signal voltage, the sensitivity of the capacitive sensor is changed, which results in changing the signal level at the input to amplifier 108. Variable voltage bias generator 132 may be implemented using a digital to analog converter followed by a charge pump as described in co-pending application Ser. No. 13/217,890, or by using other circuits, systems or techniques known in the art.

Figure 1E:
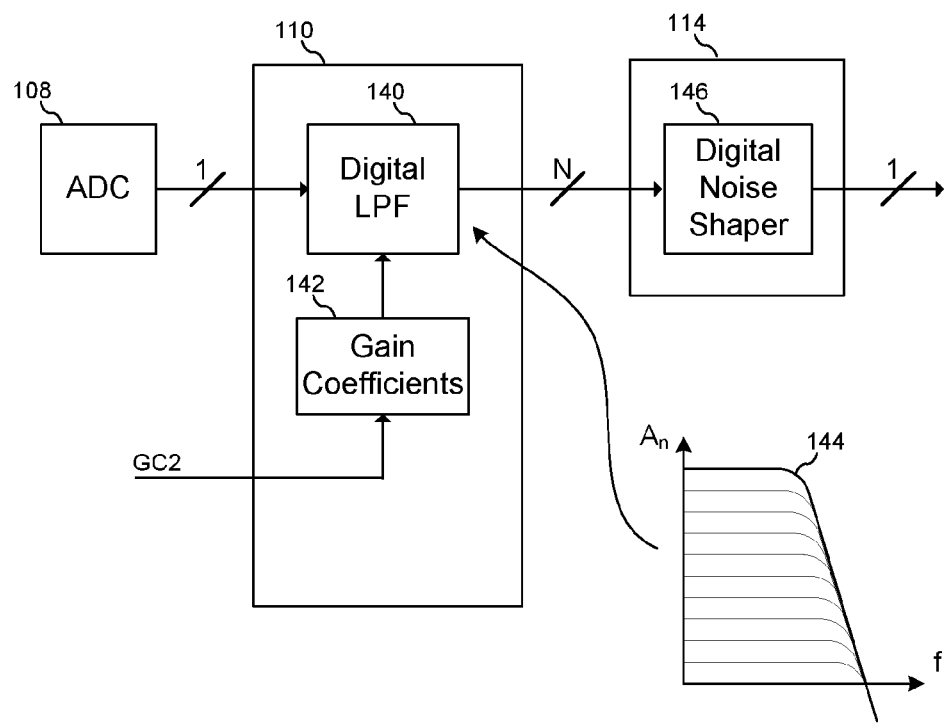

FIG. 1*e* illustrates an embodiment implementation of digital gain block no and digital interface 114. Digital gain block no may be implemented using digital filter 140 and gain coefficient selection block 142. In an embodiment, digital low pass filter 140 receives a single bit output of A/D converter 108, performs a digital low pass filter function, and produces an N-bit filter digital output signal. Alternatively, digital filter 140 may implement any other filter functions, including but not limited to a band pass and a high pass filter function. In one embodiment, digital filter 140 produces an 8-bit signal; however, other resolutions may be used. Digital filter 140 may be implemented as a finite impulse response (FIR) filter, an infinite impulse response (IIR) filter, or other digital filter type depending on the particular application and its specifications. Gain coefficient block 142 selects filter coefficients, such as z-domain filter coefficients, according to gain control signal GC2. In one embodiment, digital low pass filter 140 is a second order filter having adjustable transfer function 144 and a sample rate of between about 1 MHz and about 4 MHz. Alternatively, other filter orders, sample rates, and transfer functions may be used. Digital low pass filter 140 may also include a decimation filter for A/D converter 108.

In an embodiment, digital interface 114 is implemented using digital noise shaper 146. Digital noise shaper 146 may be implemented using a sigma-delta D/A, such as a $5^{th}$ order feedback structure with sample rate of between about 1 MHz and about 4 MHz. Alternatively, other structures may be used. In an embodiment, digital gain block no and digital interface 114 are configured to have a lower noise floor then A/D converter 108. In some embodiments, this noise floor is at least 20 dB below the noise floor of A/D converter 108; however, other margins may be used according to the particular application and its specifications.

Figure 2A:
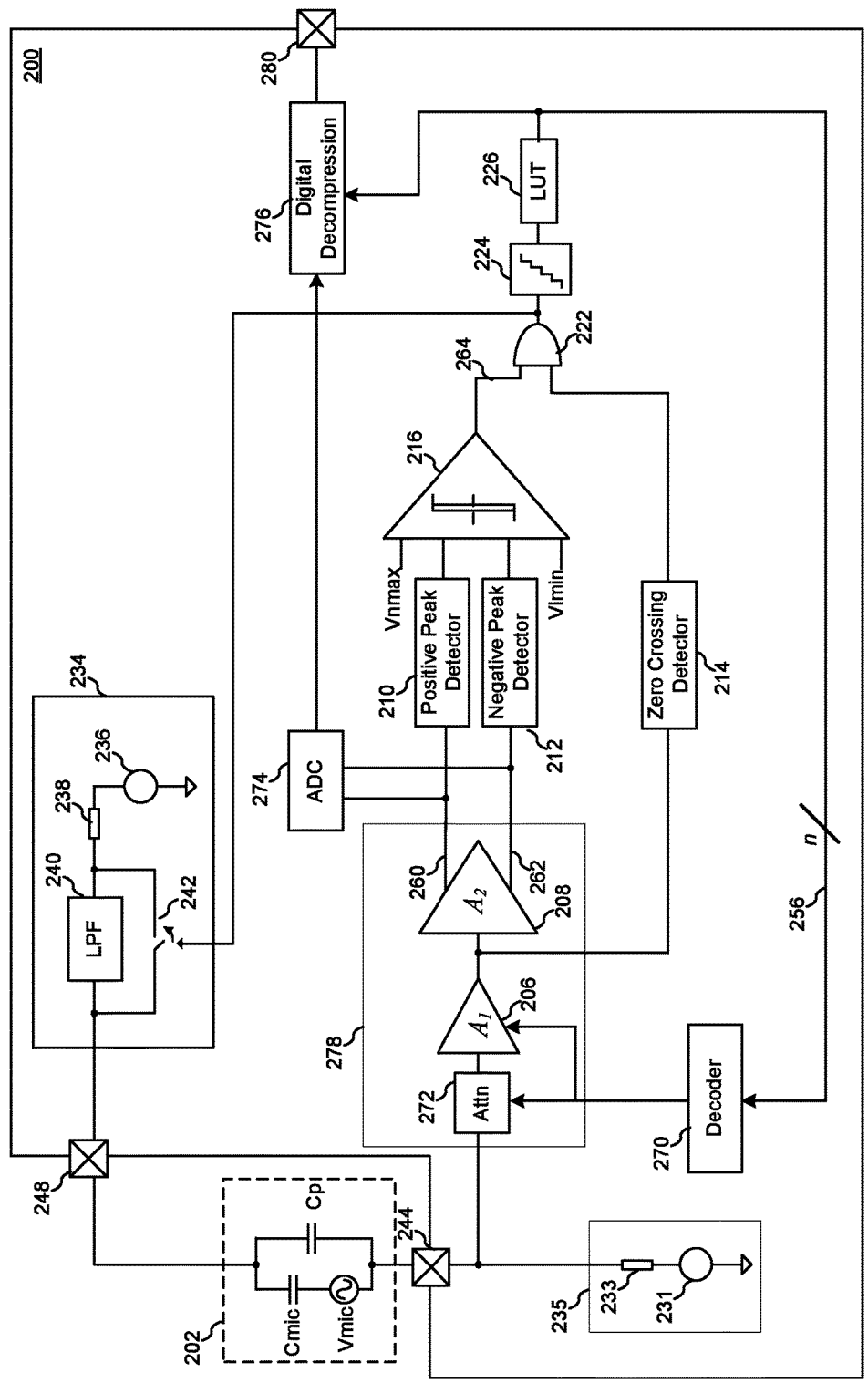
FIGS. 2a-c illustrate an embodiment amplifier integrated circuit according to another embodiment.

FIG. 2*a* illustrates IC 200 according to an embodiment of the present invention. In some embodiments, components of IC 200 may be used to implement the functionality of IC 100 illustrated in FIG. 1*a*. In an embodiment, IC 200 interfaces to MEMS microphone 202, or other type of capacitive sensor via amplifier input pin 244 and bias pin 248. Variable gain amplifier 278 may be implemented using attenuator 272, pre-amplifier 206 and amplifier 208. Amplifier 208 performs a single ended to differential conversion of the output of amplifier 206. By converting the single ended output of amplifier 206 to a differential signal, the resulting signal is made to be more insensitive to disturbances, such as power supply disturbances. In embodiments where amplifier 206 already produces a differential output signal, amplifier 208 may be omitted. Positive peak detector 210 and negative peak detector 212 are driven by outputs of 260 and 262 of amplifier 208, respectively. In an embodiment, positive and negative peak detectors 210 and 212 hold their peak values for a limited period of time, for example, between about 10 µs and about 1 ms. Of course, peak values may be held for other time periods outside of this range. Alternatively, positive and negative peak detectors 210 and 212 may have differential, rather than single ended inputs.

In an embodiment, attenuator 272 is implemented by a selectable input impedance or input signal divider using, for example, selectable capacitors and input resistors. Decoder 270 produces switch selection signals for attenuator 272 based on digital signal 256, and may also be used for changing the gain in amplifier 206 in some embodiments. Alternatively, other attenuator structures may be used.

The input to amplifier 206 may be biased by bias generator 235 represented by voltage source 231 and series resistor 233. In embodiments, this bias generator may be implemented using biasing techniques known in the art.

Zero crossing detector 214 is coupled to the output of amplifier 206. In an embodiment, the output of zero crossing detector 214 is used to ensure that switch settings of the attenuator, or signal gain changes only when a zero crossing is detected, thereby reducing audible distortion during a change of input attenuator setting. Alternatively, the input of zero crossing detector 214 may be coupled to other points in the signal chain, such as the output of single ended to differential converter 208. In further alternative embodiments of the present invention, zero crossing detector 214 may be omitted.

Differential comparator 216 compares the outputs of positive peak detector 210 and negative peak detector 212 with fixed thresholds Vnmax and Vlmin. In an embodiment, these fixed thresholds are set to correspond to an equivalent input pressure of between about 114 dBSPL and about 118 dBSPL. The absolute values of these thresholds depend on microphone sensitivity, package characteristics, bias conditions and other factors. Alternatively, thresholds corresponding to other sound pressure ranges may be used. Adjustable thresholds may also be used to provide adjustable or switchable gain profiles.

In an embodiment, the system may be configured to provide an increased gain for decreasing sound pressure levels at low input levels by introducing a second differential threshold level. Here, the amplifier gain is increased such that the signal is always above the first threshold level but below the second threshold level. In one example, the lower threshold level may be set to correspond to an ADC output level of about −15 dBFS, and the higher threshold level may be set to correspond to an ADC output level of about −12 dBFS. Other threshold levels may be used depending on the particular, system, it specifications, and the particular design of the ADC.

Comparator 216 may be implemented using Schmitt triggers, however, in alternative embodiments; other comparator types may be used. In the illustrated embodiment of FIG. 2a, comparator 216 is implemented using a differential implementation, in that the differential output of single ended to differential conversion block 208 is directly compared to a maximum positive differential signal stored in positive peak detector 210 and a maximum negative differential signal stored in negative peak detector 212.

Outputs of comparator 216 generates peak detect signal 264, which is ANDed with the output of zero crossing detector via AND gate 222. It should be appreciated that logic gate 222 is illustrative of a logic function that may be implemented in a variety of ways known in the art.

The output of AND gate, representing a detected peak at a detected zero crossing is coupled to the input of up/down counter 224. In an embodiment, a detected peak increments up/down counter 224 and a lack of a detected peak decrements up/down counter 224. The decrementation of the up/down counter goes down to a defined limit, which corresponds to the case in which attenuator 272 is configure to provide no attenuation. This is done if comparator 216 always indicates that the input signal is below the threshold levels. In some embodiments, down-counting takes longer than the up-counting. In an embodiment, the up-count and down-count rates are programmable. These rates may be selected to be in a range that does not produce audible artifacts. For example, in some embodiments, the rates are chosen to be between about 50 Hz and 200 Hz. Alternatively, other rates outside of this range may be used.

Lookup table (LUT) 226 is coupled to the output of up/down counter. In embodiments, LUT 226 outputs n-bit digital word 256, which is decoded by a decoder 270 and by digital decompression block 276. In an embodiment, n-bit digital word 256 is 8-bits; however, other bit widths may be used dependent on the particular embodiment and its specifications. Alternatively, LUT 226 may output two separate words with different bit widths for decoder 270 and for digital decompression block 276.

A/D converter 274 may be implemented using a sigma-delta A/D converter, and digital compression block 276 may be implemented using an adjustable coefficient digital filter followed by a digital noise shaper, as described in the embodiment of FIG. 1e above. Alternatively, other converter and variable gain architectures may be used. In an embodiment, digital decompression block 276 provides a single-bit bitstream output to output pin 280.

In an embodiment, bias generator 234, represented by voltage source 236, resistor 238 and low pass filter 240, outputs a bias voltage for microphone 202 on pin 248. Bias generator 234 may be implemented using, for example a charge pump and/or other techniques known in the art. In an embodiment, a low pass filter, which has a corner frequency in the mHz to Hz region, is bypassed via switch 242 during a change in attenuator setting. Bypassing low pass filter 240 allows the biasing of microphone 202 to settle quickly after a change in the setting of attenuator 272.

Figure 2B:
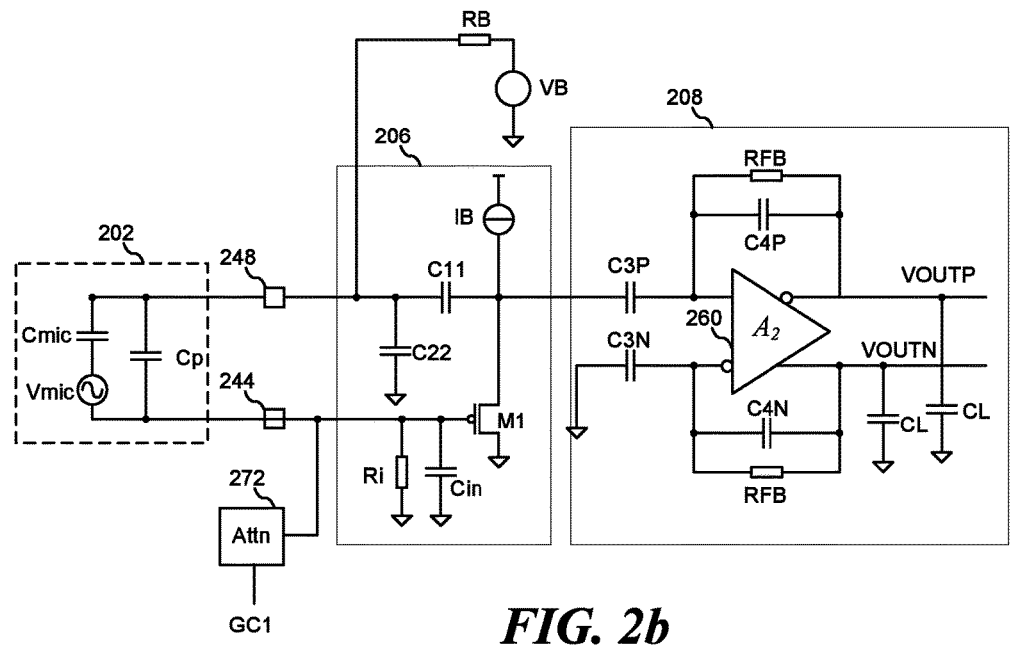

FIG. 2b illustrates an embodiment implementation of amplifiers 206 and 208 in relation to capacitive signal source 202. MEMS device 202 is coupled to first stage amplifier 206, which is further coupled to second stage 208. Attenuator 272 is coupled in shunt with input 244 of first stage amplifier 206. First stage amplifier 206 has gain boosted source follower circuit based on transistor M1 and capacitors C11 and C22, and second stage amplifier 208 has a fully differential amplifier 260 in a capacitive feedback configuration. MEMS device 202 is modeled by voltage source Vmic, microphone capacitance Cmic, and parasitic capacitance Cp. In an embodiment, MEMS device 202 is biased by voltage source VB in series with resistance RB, which has a resistance in the GΩ region. Resistance RB and capacitor C22 form a low pass filter that filters noise coming from voltage source VB. Alternatively, lower resistance values can be used for RB depending on the particular system and its specifications.

In an embodiment, bias devices VB, RB, first stage 206 and second stage 208 are disposed on a same integrated circuit (IC) 200, and MEMS microphone 202 is interfaced to IC 200 via connection pads 244 and 248. Alternatively, MEMS microphone 202 may also be disposed on the same IC 200 as first stage 206 and second stage 208, in which case the terminals of MEMS microphone 202 may be coupled to first stage 206 and bias resistor RB internally.

In an embodiment, one terminal of MEMS microphone 202 is coupled to the gate of transistor M1, and the other terminal is coupled to capacitors C11 and C22 and resistance RB. The combination of transistor M1 and capacitors C11 and C22 form a gain boosted source follower circuit. In embodiments, M1 is configured as a source follower or voltage follower device in which a signal at the gate of transistor M1 is buffered at the source of transistor M1. Because there is minimal phase shift between the gate of transistor M1 and the source of transistor M1, transistor M1 has a boosting effect on voltage Vmic. In an embodiment, the gain of the first stage 206 with respect to Vmic is about $G1=1+C11/C22$ neglecting the effect of Cmic, parasitic capacitance Cp, the transconductance of M1, and other parasitic components. In an embodiment, G1 is set to be between about 0 dB and about 20 dB. Alternatively, other values for G1 may be used depending on the particular system and its specifications.

In an embodiment, M1 is biased in the subthreshold region via current source IB in order to reduce thermal and flicker noise. In some embodiments, biasing M1 in the subthreshold region provides a good tradeoff between current consumption and thermal/flicker noise. Furthermore, device M1 is sized with a large area in order to further reduce flicker noise.

In an embodiment, second stage 208 includes differential amplifier 260 with capacitors C3P, C3N, C4P and C4N forming a capacitive feedback network. The voltage gain of second stage 206 is about C3/C4. In an embodiment, the gain of second stage 208 is set to be between about 0 dB and about 20 dB; however, gains outside of this range may also be used. High resistance feedback resistors RFB are used to bias the input of amplifier 260. In some embodiments, resistors RFB are in the GΩ range. Alternatively, lower resistance values may be used depending on the particular application and its specifications. In one embodiment, resistors RFB are implemented using diode connected MOS coupled in series. By using diode connected transistors, if the input bias voltages of amplifier 260 begin to drift, the diode connected transistors will conduct, thereby allowing a temporary DC feedback path to keep the input of amplifier 260 at a proper bias.

In an embodiment, amplifier 260 is implemented as a fully differential operational transconductance amplifier (OTA) with common mode feedback, however, other amplifier architectures, including, but not limited to a symmetrical amplifier, a folded cascode amplifier, an instrumentation amplifier, and a Miller amplifier can be used in alternative embodiments.

In an embodiment, the influence of the capacitor size Cmic in relation to capacitors present within the amplifier circuit is strongly reduced because of the lower impedance realized by driving the opposite end of C11 at the output of first stage 206 in phase with the input signal across terminals 248 and 244. The input corner frequency may be defined by the capacitance Cmic and an additional input resistance Ri that models the biasing network at the gate of M1. In an embodiment, Ri is between about 10 GΩ and about 1 TΩ. Alternatively, Ri can also be outside of this range. In some embodiments, the implementation depicted in FIG. 2b may achieve good noise performance with small sensor capacitor values.

In one embodiment, the value of Cmic is about 3.3 pF, the gain of first stage amplifier 206 is about 1, the gain of second stage amplifier 208 is about 5, the 3 dB lower corner frequency is about 20 Hz, and the 3 dB upper corner frequency is about 100 kHz. Here, output load capacitors CL limit the bandwidth of the amplifier 208 and may act as an anti-aliasing filter for A/D converter 274 (FIG. 2a) interfaced to the output of second stage 208. In alternative embodiments, the upper corner frequency can be much higher, for example 200 kHz, for higher bandwidth systems, or for systems not requiring filtering.

In an embodiment, the thermal noise of second stage 208 may be reduced by increasing C3P and C3N. Because second stage 208 is buffered by first stage 206, an increase in capacitors C3P and C3N does not directly load the outputs of MEMS microphone 202. In some embodiments, the circuit can be configured such that first stage 206 realizes a maximum gain, for example, 6 dB, and second stage 208 is used for signal mode conversion, for example converting a single ended signal to a differential signal. Second stage 208 may also be used for the adaption of sensitivity, since first stage 206 may not be able to provide 30 dB alone.

Figure 2C:
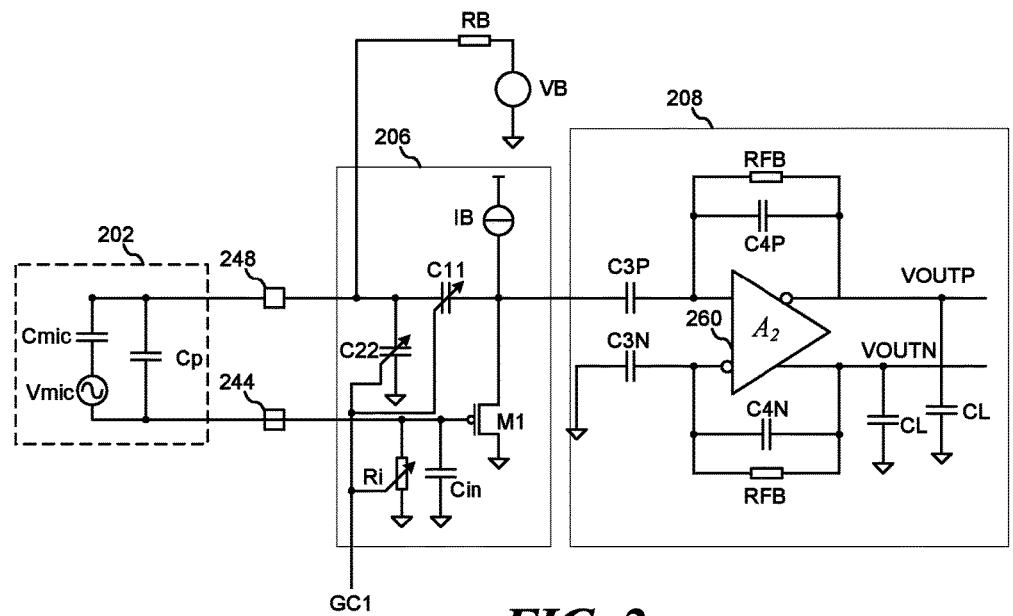

FIG. 2c illustrates a further embodiment of amplifiers 206 and 208 in which gain control signal GC1 controls the gain of amplifier 206 by adjusting the values of C11, C22 and/or Ri.

Figure 3A:
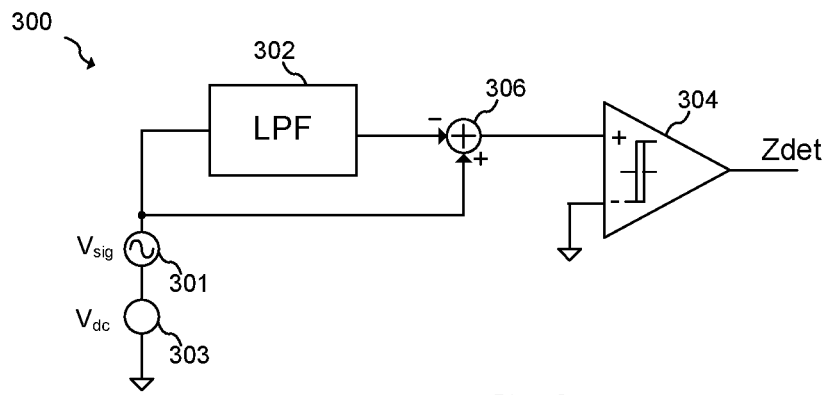
FIGS. 3a-c illustrate an embodiment zero crossing detector, an embodiment peak detector, and an embodiment timing diagram.

FIG. 3a illustrates embodiment zero crossing circuit 300 that may be used to implement zero crossing detector 214 in FIG. 2a. The input signal to zero crossing circuit 300 is represented by AC voltage source 301 in series with DC voltage source 303. Low pass filter 302 filters the input signal, and summing junction 306 subtracts the low pass filtered input signal from an unfiltered version of the input signal. In an embodiment, the corner frequency of low pass filter 302 ranges between about 1 mHz and about 10 Hz. Alternatively, other corner frequencies may be used depending on the particular application and its specifications. The combination of low pass filter 302 and 306 functions as a high pass network that filters out the dc bias voltage as well as low frequency wander. Comparator 304 compares the output of summing junction with ground or a reference voltage. Signal Zdet is accordingly activated when Vsig changes polarity. In embodiments, zero crossing detector may be implemented using circuit topologies known in the art. In some embodiments, comparator 304 is implemented using a Schmitt trigger.

Figure 3B:
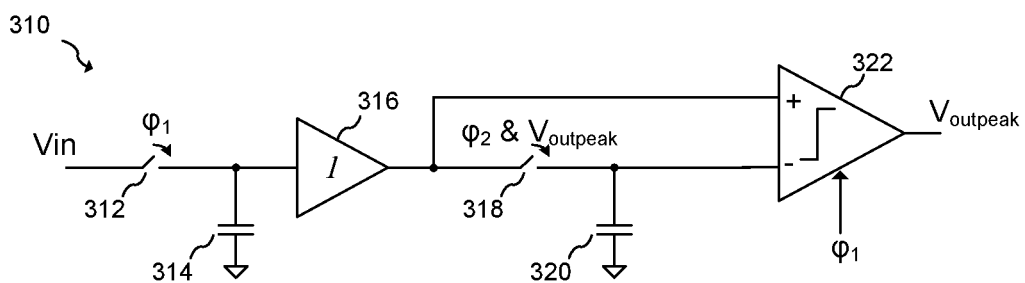
Figure 3C:
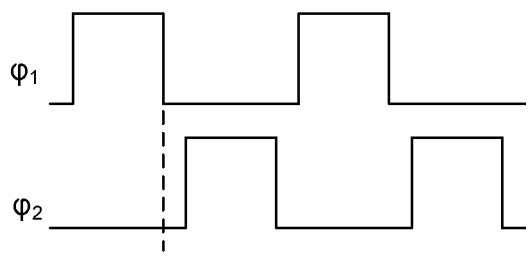

FIG. 3b illustrates embodiment peak detect circuit 310 that may be used to implement peak detectors 210 and 212 in FIG. 2a. Input voltage Vin is sampled on capacitor 314 using switch 312 that is active during phase $\phi_1$. The output of amplifier 316, buffers the voltage sampled on capacitor 314, is sampled on capacitor 320 via switch 318. Comparator 322 compares the output of buffer amplifier 316 with the sampled voltage on capacitor 320 to provide peak voltage $V_{outpeak}$. Comparator 322 is sampled during phase $\phi_1$ and switch 318 is active when phase $\phi_2$ and comparator 322 output $V_{outpeak}$ are both positive. In embodiment, circuit 310 may be implemented using, for example, switch capacitor circuit techniques known in the art. FIG. 3c illustrates an embodiment timing diagram of non-overlapping phases $\phi_1$ and $\phi_2$. In embodiments, phases $\phi_1$ and $\phi_2$ may be generated using techniques known in the art.

Figure 4A:
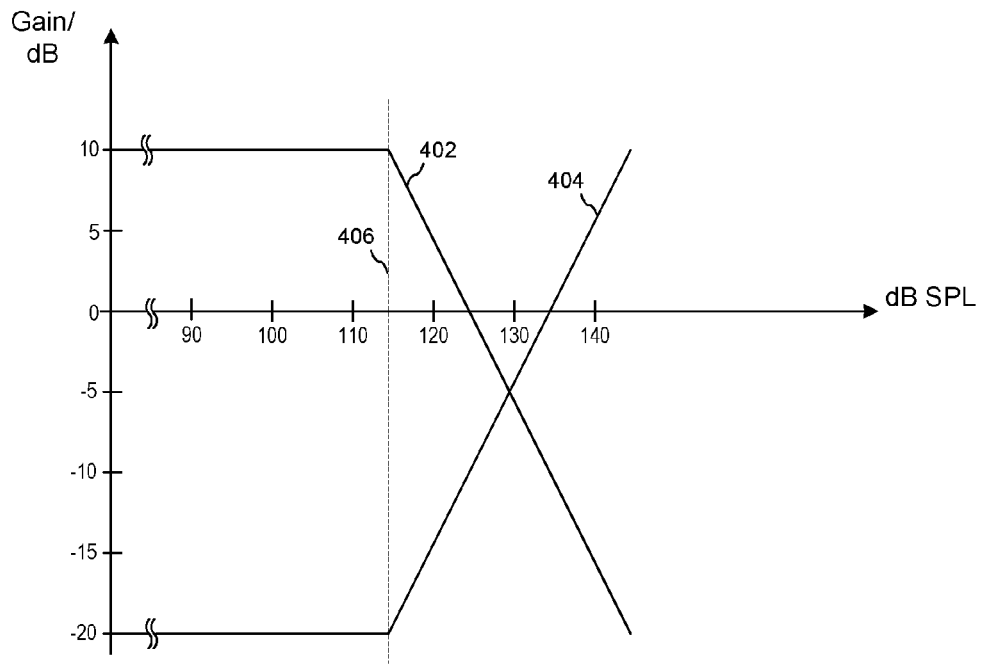
FIGS. 4a-d illustrate embodiment gain control curves.

FIGS. 4a-d illustrate an embodiment gain profiles that may be implemented using embodiment systems, for example 100 illustrated in FIG. 1a and in system 200 illustrated in FIG. 2a. FIG. 4a illustrates an embodiment gain level versus sound level input diagram. Curve 402 represents the gain of an input variable gain amplifier, and curve 404 represents the gain of the digital gain block. Dotted line 406 represents a threshold level above which compression is applied to the input variable gain amplifier and decompression is applied to the digital gain block. According to FIG. 4a, the input variable gain amplifier is set to have a gain of about 10 dB, and the digital gain block is set to have a gain of about −20 dB for input sound pressure levels up to about 115 dB SPL. Above this level, the gain of the input variable gain amplifier is reduced one dB for every one dB increase in input sound pressure level. Accordingly, the gain of the digital decompression block is increased one dB for every one dB increase in input sound pressure level above threshold 406. It should be appreciated that the decompression profile of FIG. 4a is just one example of many possible gain profiles. In alternative embodiments of the present invention, initial gains and thresholds may differ according to the particular microphone or capacitive sensor used.

Figure 4B:
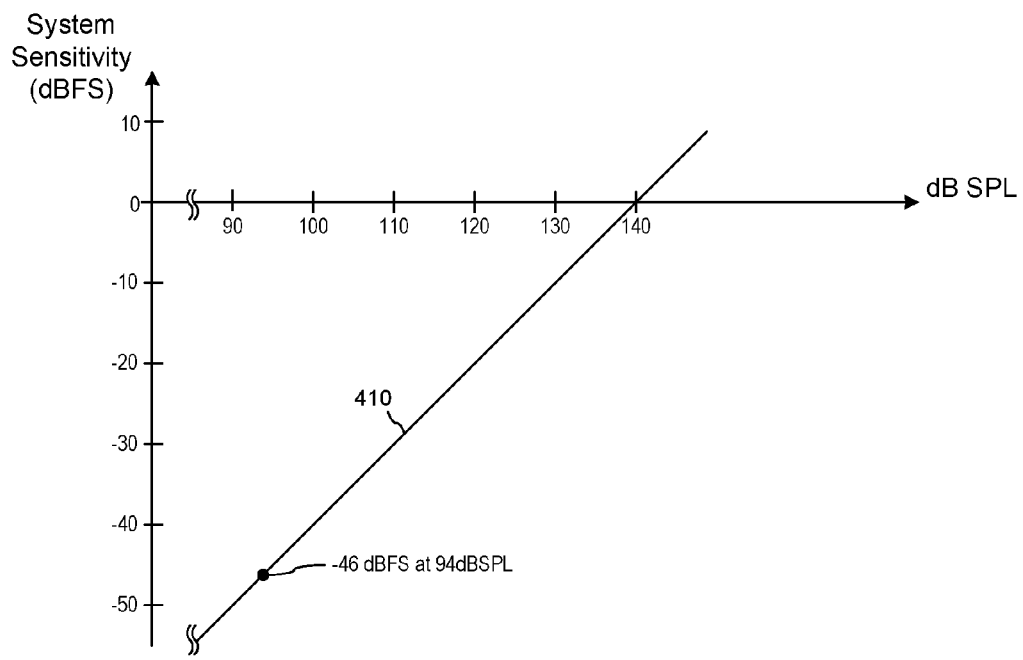

FIG. 4b illustrates a resultant system sensitivity when the gain profile of FIG. 4a is applied to a MEMS microphone having a sensitivity of −36 dBV at 94 dB SPL. Curve 410 represents the system sensitivity in dB full scale (FS) versus input sound pressure level. As can be seen by FIG. 4a, the total system sensitivity at 94 dB SPL is about −46 dB FS in the region in which 10 dB of gain is applied at the front end and −20 dB of gain is applied at the digital gain control block following the A/D converter.

Figure 4C:
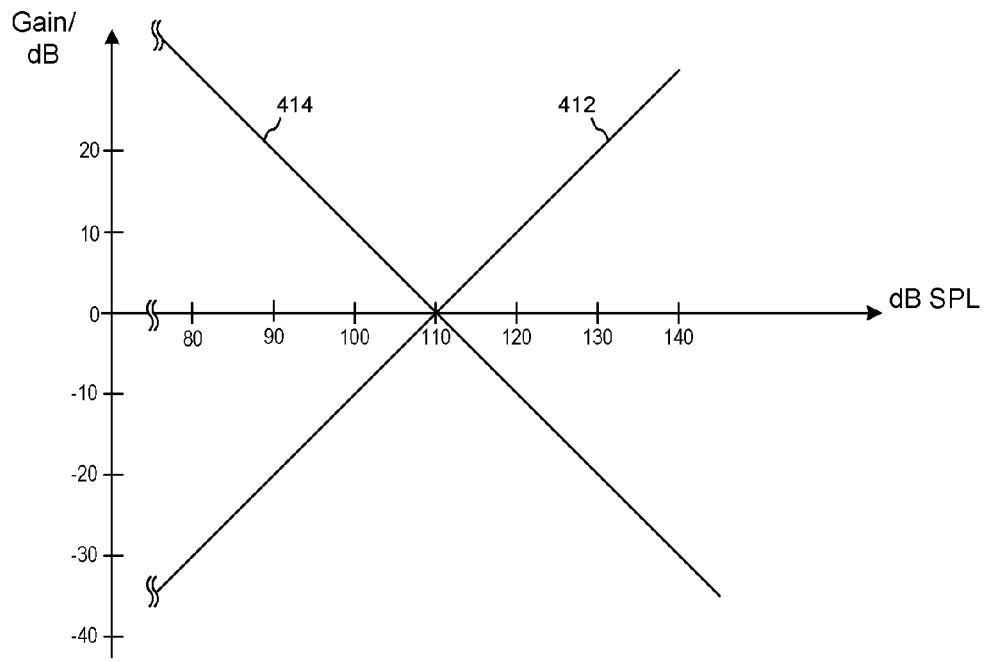
Figure 4D:
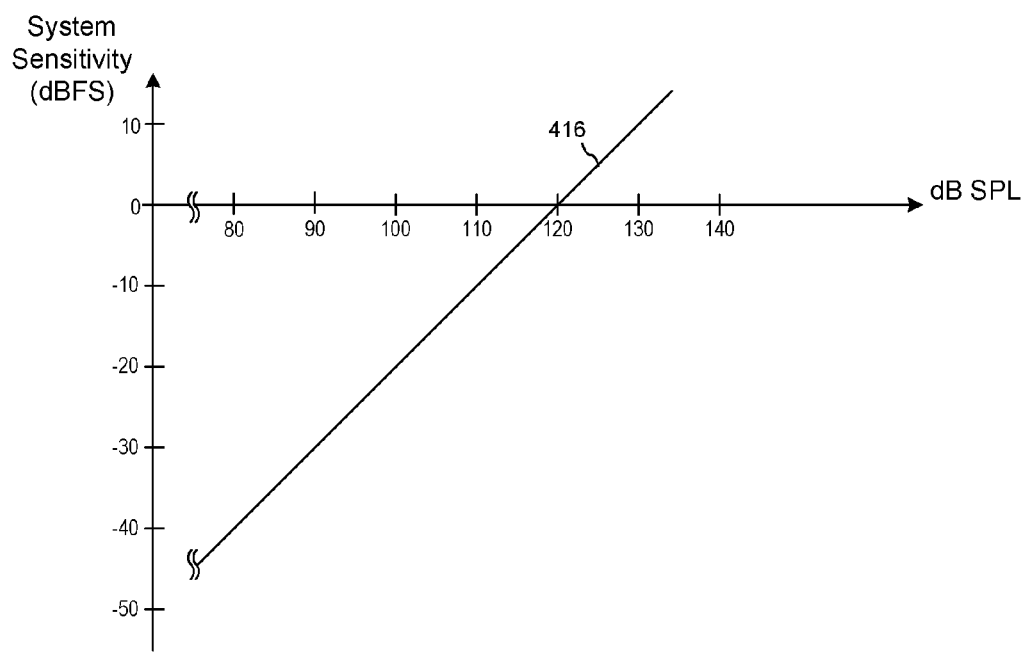

FIG. 4c illustrates a gain level versus sound level input diagram according to an alternative embodiment. Curve 414 represents the gain of an input variable gain amplifier, and curve 412 represents the gain of the digital gain block. According to FIG. 4c, the input variable gain amplifier provides an increasing gain with decreasing input sound pressure level that extends down to lower input levels, while the digital gain block provides a corresponding decreasing gain with decreasing input sound pressure levels. Curve 416 in FIG. 4d represents the system gain response that corresponds to the gain curves of FIG. 4c. In an embodiment, providing an increased gain at lower input levels may reduce noise of the A/D, as referred to the input of the variable gain amplifier, or if the same noise level should be reached, a higher noise contribution of the ADC is possible resulting in smaller area and less current consumption for the ADC.

In some embodiments of the present invention, various gain curves may be selectable or programmable in order to support different microphones and different acoustic environments. For example, in one embodiment, the gain curves depicted in FIG. 4a and in 4c may be selectively implemented in the same system. In a further embodiment, gain curves may use multiple regions. For example, the input amplifier may have a low amplitude region in which gain is increases in accordance with decreasing input amplitude or sound pressure level, a mid-amplitude region in which the gain is constant, and a high-input compression region in which the gain is decreased in accordance with an increased input amplitude. In this embodiment, the digital gain block may have a complementary gain profile that increases along with a corresponding increase of the input gain profile. In a further embodiment, the variable gain input amplifier gain profile may be mismatched with the digital gain block in order to provide a resulting system gain curve that provides compression and/or decompression.

Figure 5:
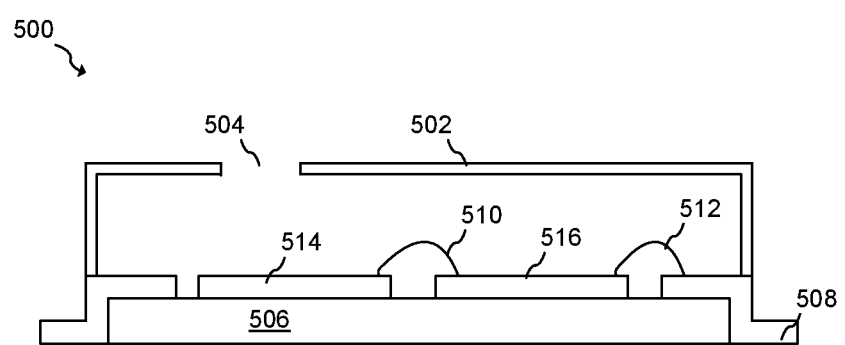
FIG. 5 illustrates an embodiment packages microphone system.

FIG. 5 illustrates embodiment package microphone amplification system 500 that includes MEMS microphone die 514 coupled to embodiment microphone interface die 516 via bond wire 510. Microphone interface die 516 may contain circuitry as described in embodiments above. In one embodiment, the bitstream output of microphone interface die 516 is coupled to leadframe and/or package pin 508 via bond wire 512. MEMS microphone die 514 and microphone interface die 516 are disposed on substrate 506 on which casing 502 is mounted. Sound port 504 allows acoustic energy to reach MEMS microphone die 514. In alternative embodiments, MEMS microphone die 514 and microphone interface die 516 may be implemented on a single die.

In accordance with an embodiment, a method includes determining an amplitude of an input signal provided by a capacitive signal source, compressing the input signal in an analog domain to form a compressed analog signal based on the determined amplitude, converting the compressed analog signal to a compressed digital signal, and decompressing the digital signal in a digital domain to form a decompressed digital signal. In an embodiment, compressing the analog signal includes adjusting a first gain of an amplifier coupled to the capacitive signal source, and decompressing the digital signal comprises adjusting a second gain of a digital processing block. In some embodiments, and adjusting the first gain of the amplifier includes adjusting the controllable impedance coupled to an output of the capacitive signal source.

In an embodiment, adjusting the first gain of the amplifier includes setting the first gain to be inversely proportional to the determined amplitude, and adjusting the gain of the digital signal processing block includes setting the second gain to be directly proportional to the determined amplitude. The first gain of the amplifier and the second gain of the digital signal processing block may be constant if the determined amplitude is less than a first threshold amplitude. In some embodiments, adjusting the first gain of the amplifier includes setting the first gain to be inversely proportional to the determined amplitude above a first threshold amplitude, and adjusting the second gain of the digital signal processing block includes setting the second gain to be directly proportional to the determined amplitude above the first threshold amplitude.

In an embodiment, the digital signal processing block includes a digital filter, and adjusting the second gain includes adjusting filter coefficients of the digital filter. In an embodiment, the method may further include converting the decompressed signal to a single bitstream. This may include using a digital noise shaper. In some embodiments, determining the amplitude of the input signal includes amplifying or buffering a signal provided by a capacitive signal source to form an amplified signal, and detecting a peak voltage of the amplified signal.

In accordance with a further embodiment, the system for amplifying a signal provided by a capacitive signal source includes a variable gain amplifier, an analog to digital converter, a digital gain block, and a gain control circuit. The variable gain amplifier includes an input node that is configured to be coupled to the capacitive signal source. The analog to digital converter is coupled to an output of the variable gain amplifier, and the digital gain block is coupled to an output of the analog to digital converter. The gain control block is configured to measure an amplitude of an analog signal coupled to the variable gain amplifier, and adjust the first gain of the variable gain amplifier according to a first gain function, and adjust the second gain of the digital gain block according to a second gain function. In some embodiments, the variable gain amplifier comprises a gain setting in which the gain of the variable gain amplifier is less than one.

In an embodiment, the first gain function defines the first gain as inversely proportional to an amplitude of the signal provided by the capacitive signal source, and the second gain function defines the second gain as proportional to the amplitude of the signal provided by the capacitive signal source. In another embodiment, the first gain function defines the first gain as inversely proportional to an amplitude of the signal provided by the capacitive signal source above a first threshold, and the second gain function defines the second gain as proportional to the amplitude of the signal provided by the capacitive signal source above the first threshold. The first gain function may further define the first gain as constant below the first threshold, and the second gain function may further define the second gain as constant below the first threshold.

In some embodiments, the system also includes the capacitive signal source, which may be a MEMS microphone, or other type of microphone. In some embodiments, the system also includes a digital noise shaper coupled to an output of the digital gain block. The digital noise shaper may include a one-bit bitstream output. In some embodiments the digital gain block includes a digital filter, and the gain control circuit is configured to adjust the second gain by adjusting filter coefficients of the digital filter. In an embodiment, the variable gain amplifier, the analog-to-digital converter, and the gain control circuit is disposed on an integrated circuit.

In accordance with a further embodiment, an integrated circuit for amplifying a signal provided by a capacitive signal source includes a signal amplifier that has an input node configured to be coupled to the capacitive signal source, a peak detector coupled to an output of the signal amplifier, a gain controller coupled to an output of the peak detector, and a controllable attenuation circuit coupled to the input node of the signal amplifier and to a first gain control signal of the gain controller. In some embodiments, the signal amplifier may have a gain of less than one. The integrated circuit further includes an analog-to-digital converter coupled to an output of the signal amplifier, a digital filter coupled to an output of the analog-to-digital converter, and a gain coefficient control block coupled to the digital filter and to a second gain control signal of the gain controller. The gain controller may be configured to increase an attenuation of the controllable attenuation circuit or decrease a gain of the signal amplifier in response to increased amplitude of the capacitive signal source, and increase a gain of the digital filter in response to the increased amplitude of the capacitive signal source. The analog to digital converter may be implemented with a sigma-delta analog to digital converter.

In an embodiment, the gain controller is configured to increase the attenuation of the controllable attenuation circuit and increase the gain of the digital filter when a signal at the output of the capacitive signal source is above a first threshold amplitude.

In an embodiment the controllable attenuation circuit includes a plurality of capacitors, and a plurality of switches coupled between the plurality of capacitors and the input of the signal amplifier, such that the plurality of switches are controllable by the gain controller. In some embodiments, the controllable attenuation circuit comprises a controllable input impedance to the signal amplifier.

An advantage of embodiment systems includes the ability to process high acoustical input signals without introducing a high non-linearity in the system. For example, in one embodiment a total harmonic distortion (THD) of less than 10% may be achieved for a MEMS microphone at an acoustic input level of 140 dBSPL. A further advantage of embodiment systems include the ability to have a very high equivalent dynamic range without expending a large amount of current and silicon area. Because high input levels do not reach the input of the A/D converter due to signal compression in the front-end amplifier, the design of the A/D converter may be optimized for small acoustic input levels. By providing higher gains at lower input levels, good noise performance may be achieved at low input levels where the dominant noise contributors are the microphone and the input amplifier.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method comprising:
   determining an amplitude of an input signal provided by a signal source;
   compressing the input signal to form a modified analog signal based on the determined amplitude;
   converting the modified analog signal to a compressed digital signal; and
   decompressing the compressed digital signal to form a decompressed digital signal.

2. The method of claim 1, wherein:
   compressing the input signal comprises adjusting a first gain of an amplifier coupled to the signal source; and
   decompressing the compressed digital signal comprises adjusting a second gain of a digital signal processing block.

3. The method of claim 2, wherein adjusting the first gain of the amplifier comprises adjusting a controllable impedance coupled to an output of the signal source.

4. The method of claim 2, wherein:
   adjusting the first gain of the amplifier comprises setting the first gain to be inversely proportional to the determined amplitude; and
   adjusting the second gain of the digital signal processing block comprises setting the second gain to be directly proportional to the determined amplitude.

5. The method of claim 4, wherein the first gain of the amplifier and the second gain of the digital signal processing block is constant if the determined amplitude is less than a first threshold amplitude.

6. The method of claim 2, wherein:
   adjusting the first gain of the amplifier comprises setting the first gain to be inversely proportional to the determined amplitude above a first threshold amplitude; and
   adjusting the second gain of the digital signal processing block comprises setting the second gain to be directly proportional to the determined amplitude above the first threshold amplitude.

7. The method of claim 2, wherein:
   the digital signal processing block comprises a digital filter; and
   adjusting the second gain comprises adjusting filter coefficients of the digital filter.

8. The method of claim 1, wherein determining the amplitude of the input signal comprises:
   amplifying or buffering a signal provided by the signal source to form an amplified signal; and
   detecting a peak voltage of the amplified signal.

9. The method of claim 1, wherein the signal source comprises a sensor.

10. The method of claim 9, wherein the sensor comprises a pressure sensor.

11. The method of claim 1, wherein the signal source comprises a microphone.

12. The method of claim 11, wherein the microphone comprises a MEMS microphone.

13. A system comprising:
    a signal source;
    a variable gain amplifier comprising an input node coupled to the signal source;
    an analog to digital converter coupled to an output of the variable gain amplifier;
    a digital gain block coupled to an output of the analog to digital converter; and
    a gain control circuit configured to
       measure an amplitude of an analog signal coupled to the variable gain amplifier,
       adjust a first gain of the variable gain amplifier according to a first gain function, and
       adjust a second gain of the digital gain block according to a second gain function.

14. The system of claim 13, wherein:
    the first gain function defines the first gain as inversely proportional to an amplitude of a signal provided by the signal source; and
    the second gain function defines the second gain as proportional to the amplitude of the signal provided by the signal source.

15. The system of claim 13, wherein:
    the first gain function defines the first gain as inversely proportional to an amplitude of a signal provided by the signal source above a first threshold; and
    the second gain function defines the second gain as proportional to the amplitude of the signal provided by the signal source above the first threshold.

16. The system of claim 15, wherein:
    the first gain function further defines the first gain as constant below the first threshold; and
    the second gain function further defines the second gain as constant below the first threshold.

17. The system of claim 13, wherein signal source comprises a pressure sensor.

18. The system of claim 17, wherein the pressure sensor comprises a MEMS microphone.

19. The system of claim 13, further comprising a digital noise shaper coupled to an output of the digital gain block.

20. The system of claim 13, wherein:
    the digital gain block comprises a digital filter; and
    the gain control circuit is configured to adjust the second gain by adjusting filter coefficients of the digital filter.

21. The system of claim 13, wherein the variable gain amplifier, the analog to digital converter, and the gain control circuit is disposed on an integrated circuit.

22. The system of claim 21, wherein the signal source is further disposed on the integrated circuit.

23. The system of claim 22, wherein the integrated circuit and signal source are disposed on a package substrate.

24. The system of claim 13, wherein the variable gain amplifier comprises a gain setting in which a gain of the variable gain amplifier is less than one.

25. A packaged system comprising:
- a signal source disposed on a package substrate; and
- a first circuit system disposed on the package substrate, the first circuit system including
  - a signal amplifier comprising an input node configured to be coupled to the signal source,
  - a peak detector coupled to an output of the signal amplifier,
  - a gain controller coupled to an output of the peak detector,
  - a controllable attenuation circuit coupled to the input node of the signal amplifier and to a first gain control signal of the gain controller,
  - an analog to digital converter coupled to an output of the signal amplifier,
  - a digital filter coupled to an output of the analog to digital converter, and
  - a gain coefficient control block coupled to the digital filter and to a second gain control signal of the gain controller, wherein the gain controller is configured to increase an attenuation of the controllable attenuation circuit or decrease a gain of the signal amplifier in response to an increased amplitude of the signal source and increase a gain of the digital filter in response to the increased amplitude of the signal source.

* * * * *